United States Patent [19]

Edwards

[11] 4,203,093
[45] May 13, 1980

[54] SOLID STATE KEYSWITCH ARRANGEMENT

[75] Inventor: Jon L. Edwards, Houston, Tex.

[73] Assignee: Texas Instruments Incorporated, Dallas, Tex.

[21] Appl. No.: 943,823

[22] Filed: Sep. 19, 1978

[51] Int. Cl.² .................. H03K 17/90; H01L 43/06
[52] U.S. Cl. .......................... 340/365 L; 323/94 H; 335/205; 338/32 H
[58] Field of Search .............. 340/365 R, 365 L; 400/479.2; 323/94 H; 307/309; 335/205, 207; 324/208; 200/67 F; 338/32 H, 32 R

[56] References Cited

U.S. PATENT DOCUMENTS

| | | | |
|---|---|---|---|
| 3,167,624 | 1/1965 | Jones | 335/205 |
| 3,233,061 | 2/1966 | Jones | 335/205 |
| 3,638,221 | 1/1972 | Bernin | 340/365 L |
| 3,668,596 | 6/1972 | Hubrich | 323/94 H |
| 3,848,216 | 11/1974 | Gammble | 340/365 L |
| 3,858,145 | 12/1974 | Sulich et al. | 323/94 H |
| 3,873,957 | 3/1975 | Wurscher et al. | 323/94 H |

*Primary Examiner*—John W. Caldwell, Sr.
*Assistant Examiner*—James J. Groody
*Attorney, Agent, or Firm*—Thomas G. Devine; Leo N. Heiting; Melvin Sharp

[57] ABSTRACT

A solid state keyboard comprised of a base module, a plurality of key members each having a plunger member comprised of a uniform mixture of a magnetic material such as barium ferrite and a binder such as nylon, and a respective plurality of improved Hall Effect generators, provides a significant improvement in performance and cost effectiveness. Actuation of a key member moves its plunger member, which has a preselected magnetic field, in rectilinear fashion relative to an improved Hall Effect generator, in which offset voltage has been substantially eliminated. This movement exposes the generator to a change in the direction of the magnetic field thus causing a corresponding change in the output voltage of the generator from a first predetermined voltage to a second predetermined voltage.

17 Claims, 4 Drawing Figures

MANUAL PRESSURE

SOLID STATE KEYSWITCH ARRANGEMENT

BACKGROUND OF THE INVENTION

This invention relates to keyboards and in particular to solid state keyboards.

Keyboards using magnetically responsive Hall Effect generators to effect solid state switching action are known in the prior art. One such keyboard is described by Dalmasso (U.S. Pat. No. 3,611,358). Attached to each keystem of the Dalmasso keyboard is a two-pole magnet which moves with the key in rectilinear fashion relative to a stationary Hall Effect generator which senses a change in the intensity of the magnetic flux as the magnet approaches and recedes. A similar keyboard is described by Maupin et al (U.S. Pat. No. 3,596,114) in which a keyswitch moves a two-pole magnet supported thereby in rectilinear fashion relative to a stationary Hall Effect generator.

Other related references are Turja (U.S. Pat. No. 3,449,517) which shows a keyboard with a Hall Effect generator moved relative to a stationary magnet, and Semmelman (U.S. Pat. No. 2,774,890) which shows the input and output terminals of a Hall Effect generator asymmetrically positioned.

Keyswitches used in prior art keyboards have permanent magnets attached to a keystem, plunger or other means for moving the magnets in rectilinear fashion in response to manipulation of the keyswitches. Because magnetic material such as barium ferrite cannot itself be molded, a binder such as nylon is required in which to suspend the barium ferrite particles and to provide a workable substance. In the preferred embodiment, a lubricating silicone is also added.

Offset voltage associated with Hall Effect generators reduces the sensitivity of Hall Effect keyboards. The greater the offset voltage, the greater intensity of magnetic flux through the generator that is needed to effect switching action. Furthermore, differences in offset voltages among various Hall Effect generators in a keyboard necessitate "tuning" or matching of particular magnets to be used with particular Hall Effect generators with different offset voltages. This increases the complexity and expense of assembling the keyboard. Finally, the two-pole magnet arrangement used in prior art keyboards does not provide the positive switching desired because the Hall Effect generators are exposed to linear changes in the magnetic field as the magnets move in response to actuation of their respective keyswitches rather than an abrupt, positive change in magnetic field. Thus, on-off switching points are not well-controlled.

BRIEF DESCRIPTION OF THE INVENTION

The present invention provides a keyboard assembly comprised of a base module, a plurality of key members each having an actuation surface and a plunger member extending therefrom comprised of a uniform mixture of magnetic material such as barium ferrite and a binder such as nylon, a respective plurality of spring members for biasing the key members and a respective plurality of improved Hall Effect generators. The modular base provides mechanical strength for the keyboard assembly while reducing the number of plastic parts needed. The barium ferrite and nylon plunger member eliminates the need for a two-piece plunger and the associated processing steps wherein permanent magnets are attached to separate plungers comprised of insulating material. Both the base module and plunger member provide high volume, automated assembly.

A portion of the plunger member is charged to form a preselected magnetic field. The magnetic flux is parallel to the axis of movement of the plunger member and is such that its direction in a first region of the plunger member along the axis of movement is the reverse of its direction in a second region of the plunger member along the axis of movement. Mounted in fixed relation with respect to the base module are a plurality of Hall Effect generators, each of which is responsive to the relative position of a respective plunger member. The plane of the generators is parallel to the base module.

Manual pressure applied to the actuation surface of a key member against the biasing of its respective spring member causes the plunger member extending therefrom to move in rectilinear fashion, perpendicular to the plane of the Hall Effect generator. The Hall Effect generator is thus exposed to a change in the direction of magnetic flux through the plane of the generator, causing the output voltage of the generator to change from a first predetermined voltage to a second predetermined voltage. Upon removal of manual pressure on the actuation surface, the biasing pressure of the spring member causes the plunger member to return to its original, non-activated position, thereby causing the generator output to change back to the first predetermined voltage. Thus, switching action is effected.

In a preferred embodiment, the base module is comprised of non-magnetic plastic such as a polyphenylene oxide and has a relatively flat major surface with a plurality of openings therein. Molded to the major surface and circumscribing each of the openings is a housing member having four rectangular side walls extending perpendicularly from the major surface to form a rectangular cavity within. Each plunger member is constrained to move rectilinearly within a respective cavity.

The plunger member has a rectangular opening in the central portion thereof extending partially between the top and bottom surfaces of the plunger member. The opening separates two parallel inner surfaces of the plunger member. Distributed along each of the inner surfaces along the axis of movement of the plunger member are three magnetic poles, adjacent poles being of opposite polarity. This unique tripole arrangement provides two regions between the inner surfaces in which the directions of the magnetic field are opposite from each other and parallel to the axis of movement of the plunger member. The abrupt change in the direction of the field provides positive switching and accurate control of on-off switch points.

The Hall Effect generators used in a preferred embodiment are of an improved type in which offset voltage has been substantially eliminated. This improved Hall Effect generator is the subject of commonly assigned copending Patent Application Ser. No. 764,931, now U.S. Pat. No. 4,141,026, filed Feb. 2, 1977, by Robert Bate et al, now U.S. Pat. No. 4,141,026, issued Feb. 20, 1979. Each such generator is mounted in a respective opening on the opposite side of the major surface of the base module and may be connected to a printed circuit board.

It is therefore an object of the present invention to provide an improved solid state keyboard.

It is another object of the invention to provide a more reliable, less expensive solid state keyboard with fewer parts designed for high volume, automated assembly.

It is yet another object of the invention to provide a solid state keyboard in which Hall Effect generator offset voltage has been substantially eliminated.

BRIEF DESCRIPTION OF THE DRAWINGS

Still further objects and advantages of the invention will be apparent from the detailed description and Claims when read in conjunction with the accompanying drawings wherein:

DETAILED DESCRIPTION OF AN EMBODIMENT OF THE INVENTION

Figure 1:
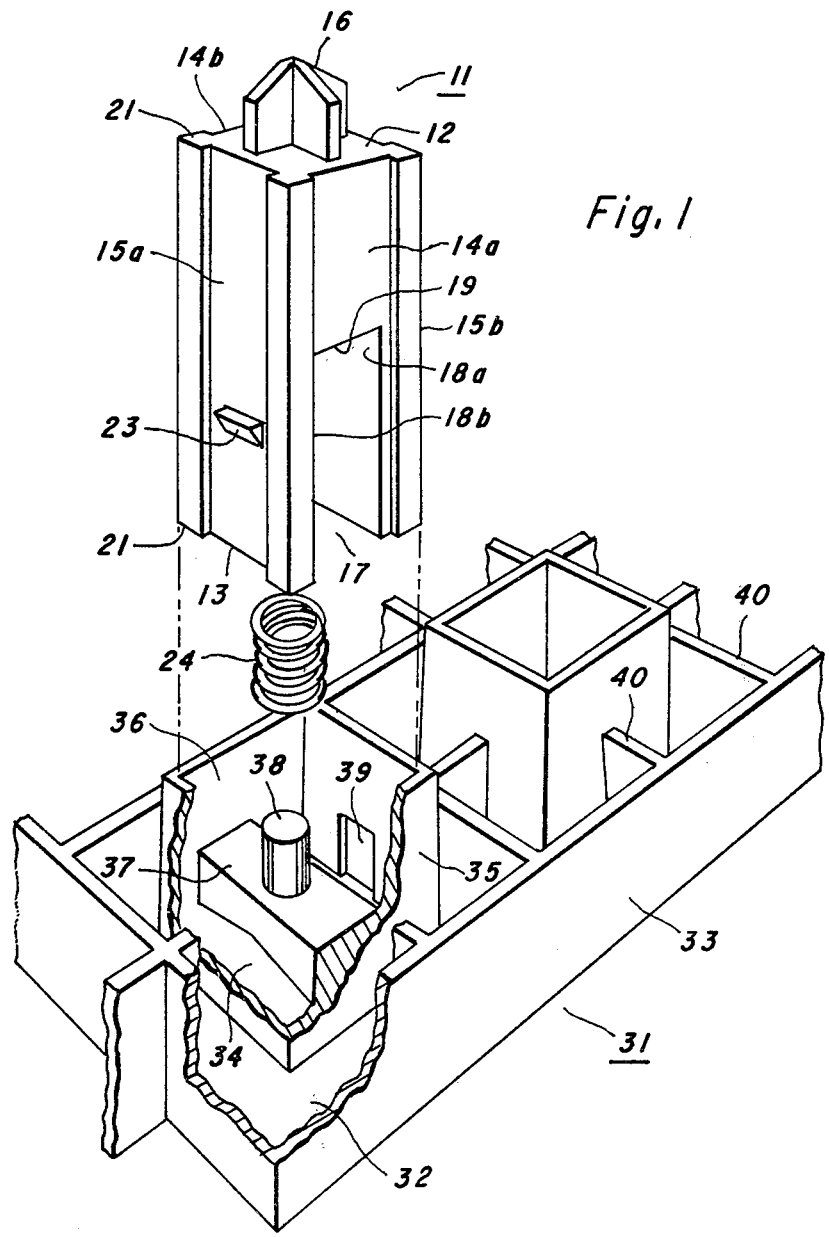
FIG. 1 is a perspective view of the components of the keyboard embodying the present invention.

FIG. 1 shows the components utilized in a preferred embodiment of the present invention. Each key includes a plunger member 11 comprised of a uniform mixture of a magnetic material such as barium ferrite and a binder such as nylon, eliminating the need for a two-or-more-piece plunger assembly having permanent magnets attached to separate plunger members or keystems. The plunger member may be injection molded in a process similar to that described in *Machine Design*, Feb. 10, 1977, pages 112-116. Plunger member 11 has a top surface 12, bottom surface 13, two mutually parallel rectangular major side wall members 14a and 14b, and two mutually parallel minor side wall members 15a and 15b. Extending from top surface 12 is mounting crucible 16 which enhances coupling of plunger member 11 to an actuation member such as a keycap (not shown) providing a key actuation surface. Bottom surface 13 has an opening 17 in the central portion thereof, extending laterally along the minor axis between major side wall members 14a and 14b, along a portion of the major axis between minor side wall members 15a and 15b, and partially from bottom surface 13 to top surface 12. Opening 17 forms inner surfaces 18a and 18b parallel to minor side wall members 15a and 15b, and inner surface 19 parallel to top surface 12. Top surface 12 is rectangular and has orthogonally positioned guide rails 21 at each of the four outside corners. Guide rails 21 run from top surface 12 to bottom surface 13 along the edges of the side wall members 14a, 14b, 15a and 15b and a portion of the surface adjacent to each edge. Projection means 23 extend from minor side wall members 15a and 15b between guide rails 21. Spring member 24 is affixed to plunger member 11 within an opening in inner surface 19.

Base module 31 is comprised of a non-magnetic plastic material such as polyphenylene oxide. It has a relatively flat major surface 32 surrounded by rectangular side wall members 33 extending perpendicularly from major surface 32. Distributed along major surface 32 are a plurality of openings 34. Molded to major surface 32 and circumscribing each of the openings 34 are housing members 35 each having four connected rectangular side walls extending perpendicularly from major surface 32 forming cavity 36. Each plunger member 11 is constrained to move rectilinearly within a respective cavity 36 of one housing member 35 during normal keyboard operation. The portions of base module 31 which contact plunger member 11 are comprised of polyphenylene oxide for structural strength and workability, and polytetrafluoroethylene to provide low friction. Molded to the central portion of the inner surfaces of two parallel side walls of each housing member 35 is a stop means 37, which engages inner surface 19 to inhibit farther travel of plunger member 11 in the direction of major surface 32. Stop means 37 extends from one side wall of housing member 35 across cavity 36 to the opposite side wall of housing member 35 and connects the two side walls thereby providing structural support for base module 31. Stop means 37 is in contact with spring member 24 at the opposite end of spring member 24 from its connection to inner surface 19. Molded to stop means 37 and extending perpendicularly therefrom is a guide means 38, which serves to stabilize the contact between spring member 24 and stop means 37. Located within housing member 35, on the inner surfaces of the side walls not connected to stop means 37 are rectangular slots 39 which form a guide channel for projection means 23. Projection means 23 engage slots 39 and limit the rectilinear movement of plunger member 11 in the direction away from major surface 32. Rectangular support members 40 extend laterally between side wall members 33 of base module 31 and perpendicularly from major surface 32 of base module 31. Support members 40 are molded to major surface 32, side wall members 33 and housing members 35 to form an interconnecting grid arrangement. This gives base module 31 structural support without the need for a bezel or other support and results in a single component, modular base design that is suitable for high volume, automated assembly and testing.

Figure 2:
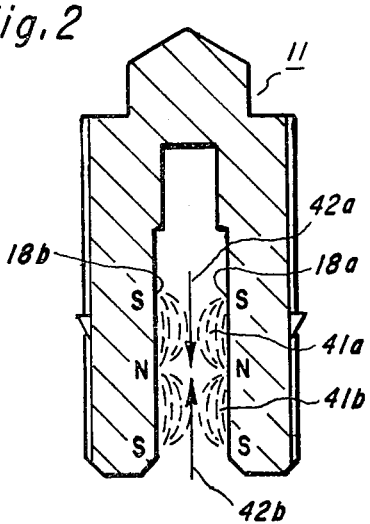
FIG. 2 is a front elevational view of a plunger member and its associated magnetic field.

Referring to FIG. 2, a portion of each inner surface 18a and 18b of plunger member 11 has a tripole magnetic arrangement in which three magnetic poles are distributed along the axis of movement of plunger member 11. Adjacent poles along the axis of movement are of opposite polarity, the resultant magnetic field between inner surfaces 18a and 18b pointing in one direction (arrow 42a) along the axis of movement in a first region 41a and pointing in the opposite direction (arrow 42b) in a second region 41b. Since the magnetic field is shielded by the inner surfaces of plunger member 11, external field effects are reduced. This unique tripole arrangement is the subject of copending U.S. application Ser. No. 955,075, filed Oct. 26, 1978 and assigned to the assignee of the present invention.

Figure 3:
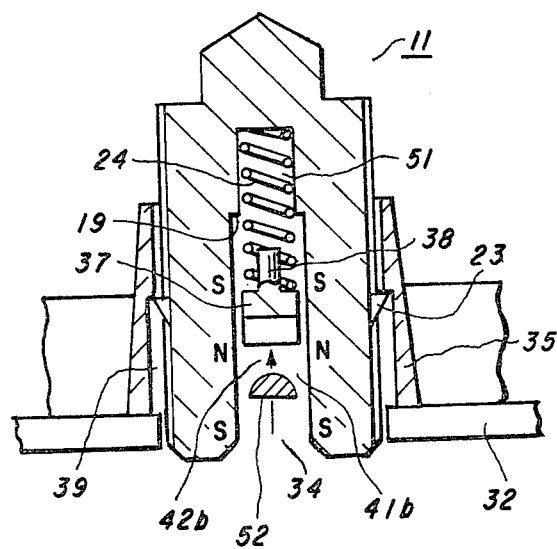
FIG. 3 is a front elevational view of a plunger member within a housing member of the base module in a nonactivated position, the front side wall of the housing member having been removed.

FIG. 3 shows plunger member 11 in a non-activated position within housing member 35. One end of spring member 24 is affixed to plunger member 11 within a cylindrical opening 51 in inner surface 19, the other end being in contact with stop means 37 and circumscribing guide means 38. Mounted in fixed relation to and within each opening 34 of base module 31 is a Hall Effect generator 52 the plane of which is parallel to flat surface 32. Generator 52 may be attached to a printed circuit board (not shown) beneath base module 31. Hall Effect generator 52 is responsive to the relative position of plunger member 11 and generates an output voltage in accordance therewith.

Hall Effect generator 52 used in a preferred embodiment is of an improved type in which offset voltage is substantially eliminated. This improved Hall Effect generator 52 has at least two plates located on a semiconductor body, the plates being positioned with respect to one another such that a line bisecting the current contacts of one plate is substantially orthogonal to a line bisecting the current contacts of the other plate. Further details regarding this improved Hall Effect generator are found in copending patent application Ser. No. 764,931, filed Feb. 2, 1977, now U.S Pat. No. 4,141,026, issued Feb. 20, 1979 by Robert Bate et al, which patent is assigned to the assignee of the present invention and is hereby incorporated herein by reference. The elimination of offset voltage makes matching or "tuning" of particular magnets to be used with Hall Effect generators unnecessary, thus reducing the complexity and expense of manufacturing the keyboard.

Figure 4:
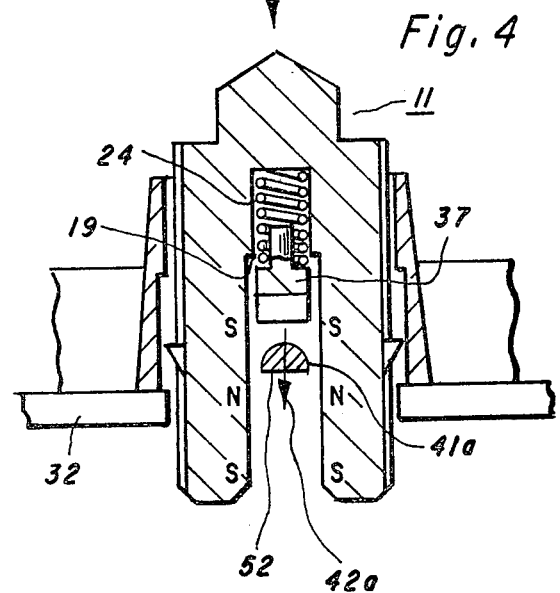
FIG. 4 is a front elevational view of a plunger member within a housing member of the base module in an activated position, the front side wall of the housing member having been removed.

Pressure applied manually to the actuation surface of a key member compresses spring member 24 and causes plunger member 11 to move in rectilinear fashion perpendicular to the plane of Hall Effect generator 52. This results in generator 52 being exposed to a reversal in the direction of the magnetic flux perpendicular to the plane of generator 52, causing the output voltage of generator 52 to change from a first predetermined voltage to a second predetermined voltage. When stop means 37 contacts inner surface 19, the movement of plunger member 11 ceases. FIG. 3 shows Hall Effect generator 52 being exposed to the magnetic flux (arrow 42b) in region 41b. The flux is parallel to the direction of movement of plunger member 11 and perpendicular to the plane of generator 52. The output of generator 52 is a first predetermined voltage. When manual pressure is applied, plunger member 11 moves rectilinearly and causes Hall Effect generator 52 to be exposed to the magnetic flux (arrow 42a) in region 41a, the direction of which is opposite from the flux direction in region 41b (see FIG. 4). The output of generator 52 changes to a second predetermined voltage. FIG. 4 shows plunger member 11 in an activated state during which manual pressure is continuously applied to the key actuation surface (not shown) above plunger member 11. Stop means 37 is in contact with inner surface 19 to preclude farther travel of plunger member 11 in the direction of major surface 32 of base module 31. Upon removal of manual pressure from the key actuation surface, spring member 24 forces plunger member 11 to return to its non-activated position as shown in FIG. 3. The output of generator 52 changes back to a first predetermined voltage. Thus, contactless switching action is effected. Projection means 23 on minor side wall members 15a and 15b engage slots 39 and limit rectilinear travel of plunger member 11 in the direction away from major surface 32. The definite reversal in the magnetic field to which generator 52 is exposed because of the movement of plunger member 11 provides positive switching and accurate control of on-off switch points. In addition, hysterisis circuitry such as a Schmitt trigger can be provided at the output of Hall generator 52 to require a signal of some minimum amplitude from generator 52 to activate the Schmitt trigger. This necessitates plunger member 11 moving some predetermined distance before Hall Effect generator 52 responds sufficiently thus preventing small fluctuations of plunger member 11 from causing fluctuations in the output of generator 52.

Since it is obvious that many additional changes and modifications can be made in the above-described details without departing from the nature and spirit of the invention, it is understood that the invention is not to be limited to said details except as set forth in the appended claims.

What is claimed is:

1. A solid state keyboard switch having at least one key member comprising an actuation member with an actuation surface for actuating a Hall Effect generator fixedly positioned with respect to the switch, comprising:
   (a) a base member having a major surface;
   (b) a plunger member extending from said actuation member, said plunger member being comprised of a uniform mixture of a magnetic material and a binder, a portion of said plunger member being charged to a preselected magnetic field, said plunger member being moveable relative to said major surface in response to manual pressure on said actuation surface;
   (c) a spring member for normally biasing said plunger member away from said major surface thereby forcing said plunger member to return to a non-activated position upon release of manual pressure from said actuation surface; and
   (d) at least one Hall Effect generator being responsive to the relative position of said plunger member for generating an electrical signal in accordance therewith.

2. The keyboard switch according to claim 1 wherein said magnetic material is barium ferrite.

3. The keyboard switch according to claim 1 wherein said binder is nylon.

4. The keyboard switch according to claim 1 wherein the plane of said Hall Effect generator lies in a plane parallel to said major surface and perpendicular to rectilinear movement of said plunger member.

5. The keyboard switch according to claim 1 wherein said base member is comprised of polyphenylene oxide and polytetrafluoroethylene.

6. The keyboard switch according to claim 1 wherein said plunger member has a top surface, a bottom surface, two major side wall members and two minor side wall members, said top surface having a projection extending from the center thereof and coupling said plunger member to said actuation member, said plunger member having an opening in the central portion thereof, extending from said bottom surface partially to said top surface, said opening forming inner surfaces substantially parallel to said top surface and said minor side wall members.

7. The keyboard switch according to claim 1 wherein said base member includes at least one housing member extending perpendicularly from and being integral with said major surface to form a cavity for containing said plunger member.

8. The keyboard switch according to claim 7 wherein said housing member has four rectangular side walls forming a rectangular cavity.

9. The keyboard switch according to claim 7 wherein said base module has a plurality of openings in said major surface, each of said openings being circumscribed by a respective housing member.

10. The keyboard switch according to claim 7 wherein each plunger member is constrained to move rectilinearly within a respective housing member.

11. A solid state keyboard having at least one key member comprising an actuation member with an actuation surface for actuating a Hall Effect generator fixedly positioned with respect to the keyboard, comprising:

(a) a base member having a major surface and a plurality of housing members extending perpendicularly from and being integral with said major surface;

(b) at least one plunger member comprised of a uniform mixture of a magnetic material and a friction resistant material, said plunger member having a top surface, a bottom surface, two major side wall members and two minor side wall members, said top surface having a projection extending from its center and coupling said plunger member to said actuation member, said plunger member having an opening in the central portion thereof, extending from said bottom surface partially to said top surface, said opening forming inner surfaces substantially parallel to said top surface and said minor side wall members; and (c) at least one spring member for normally biasing said plunger member away from said major surface thereby forcing said plunger member to return to a non-activated position upon release of manual pressure from said actuation surface; and (d) at least one Hall Effect generator the plane of said generator being parallel to said major surface and perpendicular to rectilinear movement of said plunger member, said generator being responsive to the relative position of a respective plunger member for generating an electrical signal in accordance therewith.

12. The keyboard according to claim 11 wherein said magnetic material is barium ferrite.

13. The keyboard according to claim 11 wherein said binder is nylon.

14. The keyboard according to claim 11 wherein said base member is comprised of polyphenylene oxide and polytetrafluoroethylene.

15. The keyboard according to claim 11 wherein said base member has a plurality of openings in said flat surface, each of said openings being circumscribed by a respective one of said housing members.

16. The keyboard according to claim 11 wherein each of said housing members has four rectangular side walls forming a rectangular cavity.

17. The keyboard according to claim 11 wherein each plunger member is constrained to move rectilinearly within a respective housing member.

* * * * *